US007977977B1

(12) United States Patent
Natarajan et al.

(10) Patent No.: US 7,977,977 B1
(45) Date of Patent: Jul. 12, 2011

(54) DYNAMIC LOGIC CIRCUIT WITH DEVICE TO PREVENT CONTENTION BETWEEN PULL-UP AND PULL-DOWN DEVICE

(75) Inventors: Karthik Natarajan, Austin, TX (US); Giridhar Narayanaswami, Austin, TX (US); Spencer M. Gold, Pepperell, MA (US); Stephen Kosonocky, Ft. Collins, CO (US); Ravi Jotwani, Austin, TX (US); Michael Braganza, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 12/717,322

(22) Filed: Mar. 4, 2010

Related U.S. Application Data

(60) Provisional application No. 61/301,818, filed on Feb. 5, 2010.

(51) Int. Cl.
*H03K 19/96* (2006.01)
(52) U.S. Cl. ....... 326/98; 326/95; 365/203; 365/230.02; 365/189.02
(58) Field of Classification Search .............. 326/93–98; 365/194, 191, 230.02, 203
See application file for complete search history.

(56) References Cited

U.S. PATENT DOCUMENTS

| 6,552,949 | B1 * | 4/2003 | Silla et al. ................ 365/227 |
| 6,794,901 | B2 * | 9/2004 | Bernstein et al. ............ 326/95 |
| 6,894,528 | B2 * | 5/2005 | Gauthier et al. ............. 326/16 |
| 6,914,452 | B2 * | 7/2005 | Gauthier et al. ............. 326/98 |
| 7,034,576 | B2 * | 4/2006 | Levy et al. .................. 326/98 |
| 7,109,757 | B2 * | 9/2006 | Yuan et al. .................. 326/95 |
| 7,209,394 | B1 * | 4/2007 | Dankert et al. ......... 365/189.02 |
| 7,256,621 | B2 * | 8/2007 | Lih et al. .................. 326/121 |
| 7,598,774 | B2 | 10/2009 | Belluomini et al. |
| 7,679,403 | B2 | 3/2010 | Erstad |
| 2008/0250289 | A1 * | 10/2008 | Gloekler et al. ............ 714/733 |
| 2008/0298143 | A1 * | 12/2008 | Chen et al. .................. 365/194 |
| 2009/0175107 | A1 * | 7/2009 | Christensen et al. ......... 365/203 |

* cited by examiner

*Primary Examiner* — Vibol Tan
(74) *Attorney, Agent, or Firm* — Meyertons, Hood, Kivlin, Kowert & Goetzel, P.C.; Erik A. Heter

(57) ABSTRACT

A circuit including is disclosed. The circuit includes a precharge circuit configured to pull a dynamic node toward a voltage present on the voltage supply node during a precharge phase, and an evaluation circuit configured to, during an evaluation phase, pull the dynamic node toward a ground voltage responsive to a first input condition and configured to inhibit pulling of the dynamic node down responsive to a second input condition. A pull-up circuit coupled between the first dynamic node and the voltage supply node includes first and second pull-up transistors. The first pull-up transistor is configured to activate responsive to the precharge phase. The second pull-up transistor is configured to activate at a delay time subsequent to entry of the evaluation phase. When the first and second pull-up transistors are active, a pull-up path is provided between the dynamic node and the voltage supply node.

20 Claims, 7 Drawing Sheets

DYNAMIC LOGIC CIRCUIT WITH DEVICE TO PREVENT CONTENTION BETWEEN PULL-UP AND PULL-DOWN DEVICE

PRIORITY INFORMATION

This application claims priority to U.S. provisional application Ser. No. 61/301,818, entitled "Dynamic Logic Circuit With Device To Prevent Contention Between Pull-Up And Pull-Down Device", filed Feb. 5, 2010.

BACKGROUND

1. Field of the Invention

This invention relates to electronic circuits, and more particularly, to dynamic logic circuits.

2. Description of the Related Art

Dynamic logic circuits are well known in the electronic arts. Operation of a dynamic circuit may be divided into a precharge phase and an evaluate phase. During the precharge phase, a dynamic node may be precharged to a logic high voltage. The precharge may be accomplished by a PMOS (p-channel metal oxide semiconductor) transistor coupled between the dynamic node and a voltage supply node. During the evaluation phase, the dynamic node may either be discharged low or may be held high, depending on the input to the dynamic circuit. For example, if an NMOS (n-channel metal oxide semiconductor) transistor is coupled between the dynamic node and a ground node, the dynamic node may be pulled low during the evaluation phase if the input (i.e. the gate terminal of the NMOS transistor) is high, thus activating the NMOS device. Otherwise, if the NMOS device remains inactive during the evaluation phase (i.e. the gate terminal is low), the dynamic node may be held high. A keeper or half-keeper device may be included in the dynamic logic circuit to hold the dynamic node high if it evaluates high during the evaluation phase.

The precharge and evaluation phases in many dynamic logic circuits may be controlled by a clock signal. The precharge phase may occur during the low phase of the clock cycle, while the evaluation phase may occur during the high phase of the clock cycle. The clock signal may be provided to the gate terminal of a PMOS transistor coupled between the dynamic node and the voltage supply node. Thus, when the gate terminal is low (due to the clock low), the PMOS transistor will turn on and precharge the dynamic node. When the clock transitions high, the PMOS transistor will turn off, thus enabling the evaluation phase to begin.

SUMMARY OF THE DISCLOSURE

A circuit including a dynamic logic circuit is disclosed. In one embodiment, the circuit includes a precharge circuit configured to, during a precharge phase, pull a dynamic node toward a voltage present on the voltage supply node. The circuit further includes an evaluation circuit configured to, during an evaluation phase, pull the dynamic node toward a ground voltage responsive to a first input condition, and further configured to inhibit pulling of the dynamic node toward the ground voltage responsive to a second input condition. A pull-up circuit is coupled between the first dynamic node and the voltage supply node, and includes first and second pull-up transistors. The first pull-up transistor is configured to activate responsive to the precharge phase. The second pull-up transistor is configured to activate at a delay time subsequent to entry of the evaluation phase. When the first and second pull-up transistors are active, a pull-up path is provided between the dynamic node and the voltage supply node.

In one embodiment, a method for operating a dynamic logic circuit includes precharging a dynamic node of a dynamic circuit to a first logic value during a first phase of a clock signal, and activating, responsive to said precharging, a first device of a pull-up circuit coupled between the dynamic node and a voltage supply node. The method further includes ending the precharge phase and beginning an evaluation phase responsive to the clock signal transitioning from the first phase to a second phase and providing an input signal to an evaluation circuit coupled to the dynamic node. A logic value on the dynamic node is evaluated responsive to providing the input signal. A second device of the pull-up circuit is activated at a predetermined delay time subsequent to beginning the evaluation phase.

BRIEF DESCRIPTION OF THE DRAWINGS

Other aspects of the invention will become apparent upon reading the following detailed description and upon reference to the accompanying drawings in which.

Figure 1:
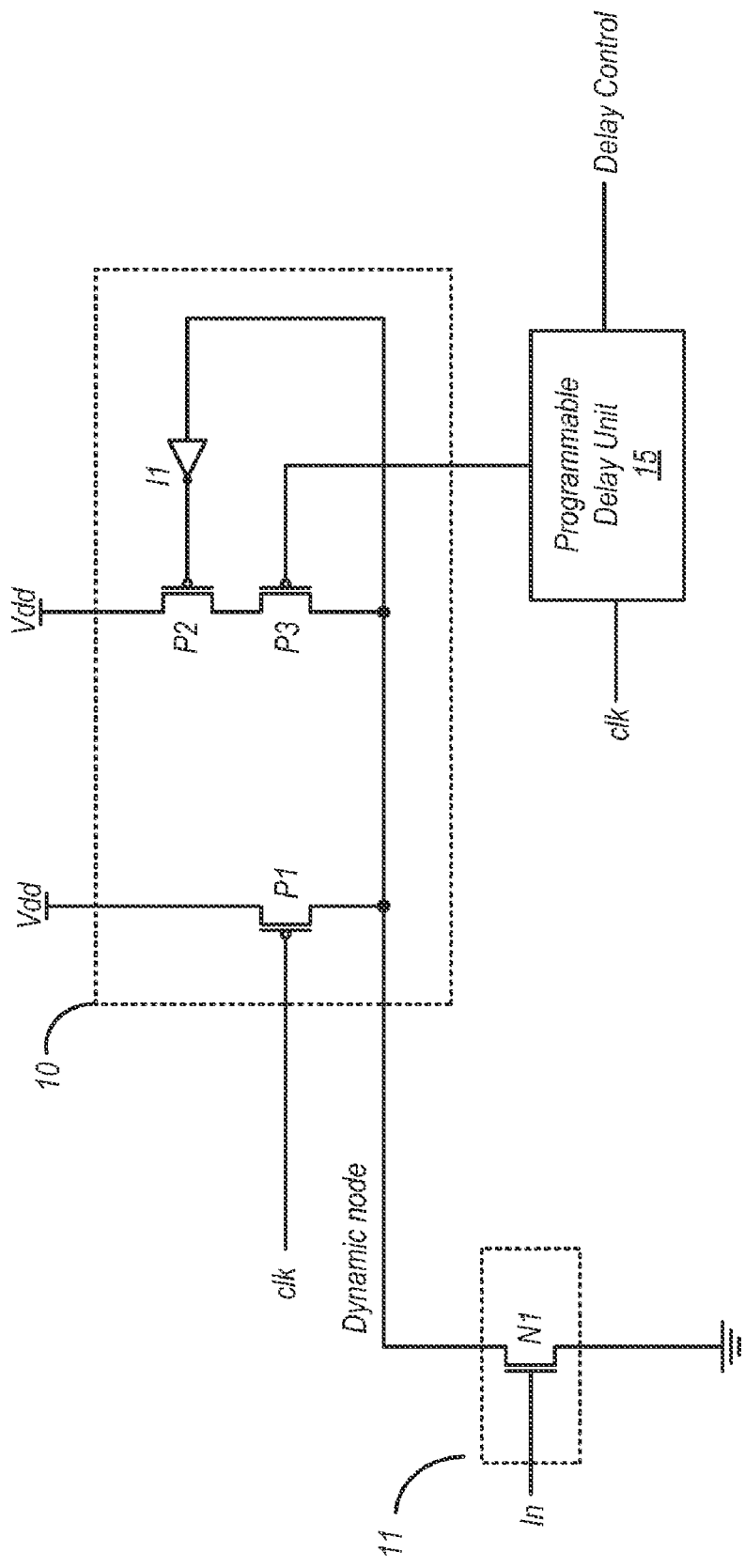
FIG. 1 is a schematic diagram illustrating one embodiment of a dynamic logic circuit.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION

Dynamic Logic Circuit

Turning now to FIG. 1, a schematic diagram illustrating one embodiment of a dynamic logic circuit is shown. In the embodiment shown, dynamic logic circuit 10 is coupled to input circuit 11 and a programmable delay unit 15. Input circuit 11 in this embodiment is an NMOS (n-channel metal oxide semiconductor) transistor, N1, although numerous other embodiments of an input circuit are possible and contemplated. Transistor N1 is coupled between the dynamic node and a ground terminal (at a ground voltage) in this example. When active, transistor N1 may provide a pull-down path between the dynamic node and the ground terminal.

A precharge circuit in the embodiment shown is implemented by transistor P1, which is coupled between the dynamic node and a voltage supply node (Vdd). A gate terminal of transistor P1 is coupled to receive a clock signal ('clk'). When the clock signal is low, transistor P1 may activate, thereby pulling the dynamic node up towards the supply voltage. When the clock signal transitions high, transistor P1 may deactivate, thus ending the precharge. The transitioning of the clock signal from low to high in this embodiment also indicates the beginning of the evaluation phase of dynamic logic circuit 10.

A pull-up circuit in this embodiment is implemented with transistors P2 and P3. Transistor P2 may be activated when the dynamic node is pulled high during the precharge operation. A gate terminal of transistor P2 is coupled to the output of inverter I1, which has an input coupled to the dynamic node. Accordingly, when the dynamic node is precharged high, inverter I1 outputs a low, thereby causing activation of transistor P2.

Transistor P3 in the embodiment shown may be activated responsive to a signal received from programmable delay unit 15. More particularly, transistor P3 is configured to be activated when programmable delay unit 15 asserts a logic low on its gate terminal. In this embodiment, programmable delay unit 15 is coupled to receive the clock signal, and is configured to assert the signal on the gate terminal of transistor P3 at a predetermined delay time following the beginning of the evaluation phase. Since P3 is a PMOS (p-channel metal oxide semiconductor) transistor in the embodiment shown, the signal asserted by programmable delay unit 15 is active low.

The use of transistor P3 in the embodiment shown may eliminate contention issues between the pull-up circuit and the pull-down circuit of evaluation circuit 11. In this embodiment, transistor N1 is activated responsive to a logic high received on its gate terminal ('In'). When transistor N1 is active, the dynamic node may be pulled low. The pulling low of the dynamic node may in turn cause the deactivation of transistor P2, since inverter I1 may respond to the low on the dynamic node by outputting a logic high. The high output from inverter I1 may be slightly delayed relative to when the dynamic node is pulled low, and thus for at least a brief period, both N1 and P2 may be active. However, if transistor P3 is off for a sufficient time while transistor N1 is pulling the dynamic node low, contention between transistors N1 and P2 may be prevented.

In contrast, an embodiment wherein transistor P2 was directly coupled to the dynamic node (i.e. where P3 is not present), contention may arise between N1 and P2 during the evaluation phase when transistor N1 is active. Furthermore, if the drive strengths of N1 and P2 were not balanced correctly, a situation could arise where N1 lacks sufficient strength to overdrive P2 and pull the dynamic node low. This in turn could cause erroneous operation of the circuit, as it would be unable to evaluate the dynamic node to a logic low. However, these contention issues may be prevented in the embodiment shown in FIG. 1 by providing transistor P3 and holding it inactive for the delay time subsequent to entering the evaluation phase. If the input signal is such that the dynamic node should evaluate low, transistor N1 may be allowed sufficient time to pull the dynamic node low and cause transistor P2 to deactivate before transistor P3 is turned on.

If, during the evaluation phase, the input signal to evaluation circuit 11 (i.e., 'In' coupled to the gate of transistor N1) is low, the dynamic node may evaluate high. A low input to the gate of N1 may cause this device to be inactive. Since the dynamic node is precharged during the precharge phase, the node may remain high during the evaluation phase when transistor N1 remains inactive. However, even when inactive, transistor N1 may be subject to leakage currents that could cause the voltage level on the dynamic node to degrade if the node is not otherwise pulled high. Such leakage problems may be exacerbated in embodiments in which a number of evaluation circuits share a common dynamic node, as will be discussed in further detail below. However, activation of transistor P3 after the delay time has elapsed may provide a pull-up path between the dynamic node and Vdd, which may in turn guarantee the high on the dynamic node. As previously noted, transistor P2 may activate during the precharge phase responsive to inverter I1 driving a low on its gate (which may occur in turn due to the high on the input of I1). If transistor P3 is turned on before leakage as pulled the voltage on the dynamic node sufficiently low, the pull-up path from the dynamic node and Vdd may be restored.

Setting the delay provided by programmable delay unit 15 may thus be a balancing act between providing a sufficient amount of time to enable transistor N1 to pull the dynamic node low without contention while also activating transistor P3 in time to prevent leakage currents from causing a logic high to degrade into a logic low. This delay may be tuned during a final testing phase of an integrated circuit (IC) or other device in which the circuit is implemented, before shipping to a customer, or may be determined at other times during operation of the IC (e.g., during a boot-up phase). Testing may be conducted to find a range of values which satisfies the requirements of enabling contention free operation while also activating transistor P3 fast enough to prevent leakage from causing an erroneous value to appear on the dynamic node. After determining such a range of values, programmable delay unit 15 may receive information through a delay control input which sets the delay. In some embodiments, the delay time may be set once and may remain as the permanent delay for the life of the circuit. In other embodiments, the delay time may be adjustable at times subsequent to its initial setting to allow for changing operating conditions or degradation that may occur over the lifetime of the circuit. For example, embodiments are possible and contemplated wherein programmable delay unit 15 provides a first delay time when operating in a high performance mode (e.g., with a high clock frequency) and a second delay time when operating in a low power mode (e.g., with a clock frequency lower than that uses in the high performance mode).

Figure 2:
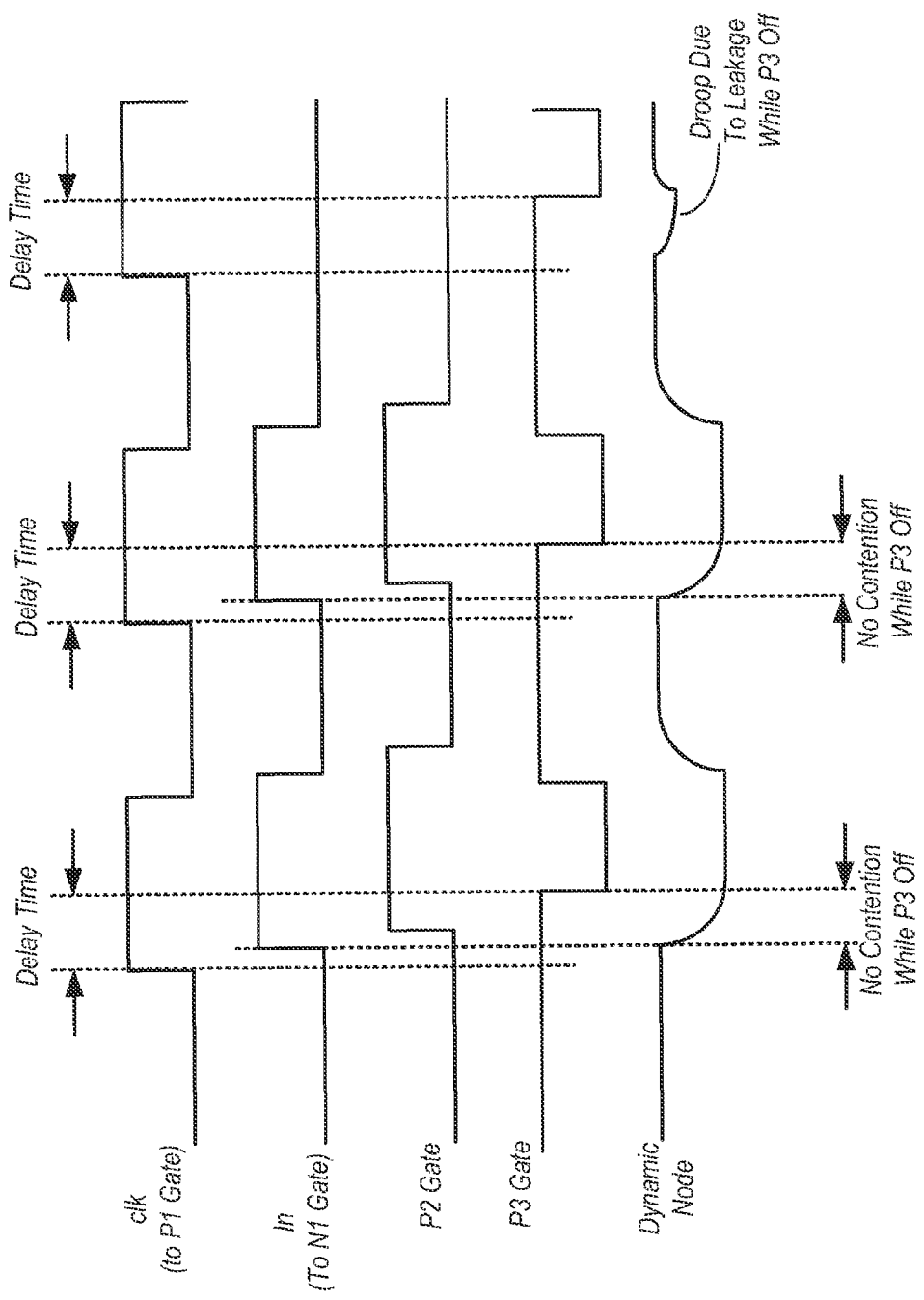
FIG. 2 is a timing diagram illustrating the operation of one embodiment of a dynamic logic circuit.

Timing Diagram:

FIG. 2 is a timing diagram illustrating the operation of one embodiment of a dynamic logic circuit. More particularly, FIG. 2 illustrates the operation of the embodiment of dynamic logic circuit 10 shown in FIG. 1, although this timing diagram is exemplary and may apply to other embodiments as well. In the example shown, the clock signal is provided to the gate of transistor P1. Since P1 is a PMOS transistor, the low on its gate may cause it to activate. The dynamic node may be pulled high when transistor P1 is active. The precharge phase ends when the clock signal transitions high (thereby deactivating P1), however, the dynamic node may remain high since N1 remains off at the rising clock edge in this example.

Subsequent to the rising edge of the clock signal, an input signal 'In' is received on the gate terminal of N1. When transistor N1 becomes active, a pull-down path is provided between the dynamic node and the ground node. At the point where N1 becomes active in this example, transistor P3 is off since its gate terminal is high. Accordingly, the pull-up path through transistor P2 and P3 is blocked while the pull-down path is active at this point in the operation, thereby causing the dynamic node to be pulled low. The pulling of the dynamic node low may be accomplished without contention between transistor N2 and transistor P2, since the pull-up path is blocked when P3 is turned off. Furthermore, as the dynamic node falls low, the gate terminal of transistor P2 will be driven high (from the output of inverter I1), and thus transistor P2 is turned off.

At a predetermined delay time after the clock transitions from low to high, the programmable delay unit 15 may assert an active low signal to the gate of transistor P3. However, since transistor P2 has already been turned off in this example, no pull-up path is provided between the dynamic node and the voltage supply node. Accordingly, the dynamic node remains low at this point in the example, since transistor N1 is active and thus provides the pull-down path. The programmable delay unit 15 may be configured to de-assert the active low signal to the gate of transistor P3 responsive to the clock signal transitioning low again, and before or concurrent with the activation of transistor P2 that results from the precharge operation.

The cycle described above repeats itself in a second cycle in the example presented in FIG. 2. However, in a third cycle of this example, the input to the gate terminal of transistor N1 remains low during the evaluation phase. Accordingly, transistor N1 remains turned off, and the dynamic node should evaluate to a logic high during the evaluation phase. Transistor P2 may also remain active as a result of inverter I1 continuing to drive a low on its gate terminal. However, even though transistor N1 is off, the it may still be subject to leakage currents, which can, without the presence of a pull-up path, degrade the voltage on the dynamic node that originally resulted from the precharge. This is shown by the droop in the dynamic node voltage shown in this example. Since transistors N1 and P3 are both off at this point in the example, the dynamic node may float, and the voltage thereon may degrade due to leakage as described above. Once the delay time has elapsed and the programmable delay unit 15 asserts the active low signal on the gate terminal of transistor P3, the pull-up path may be provided through transistors P2 and P3. Thus, the dynamic node may be pulled high and thus counteract the leakage that may occur through transistor N1 and reinforce the evaluated logic high.

Figure 3:
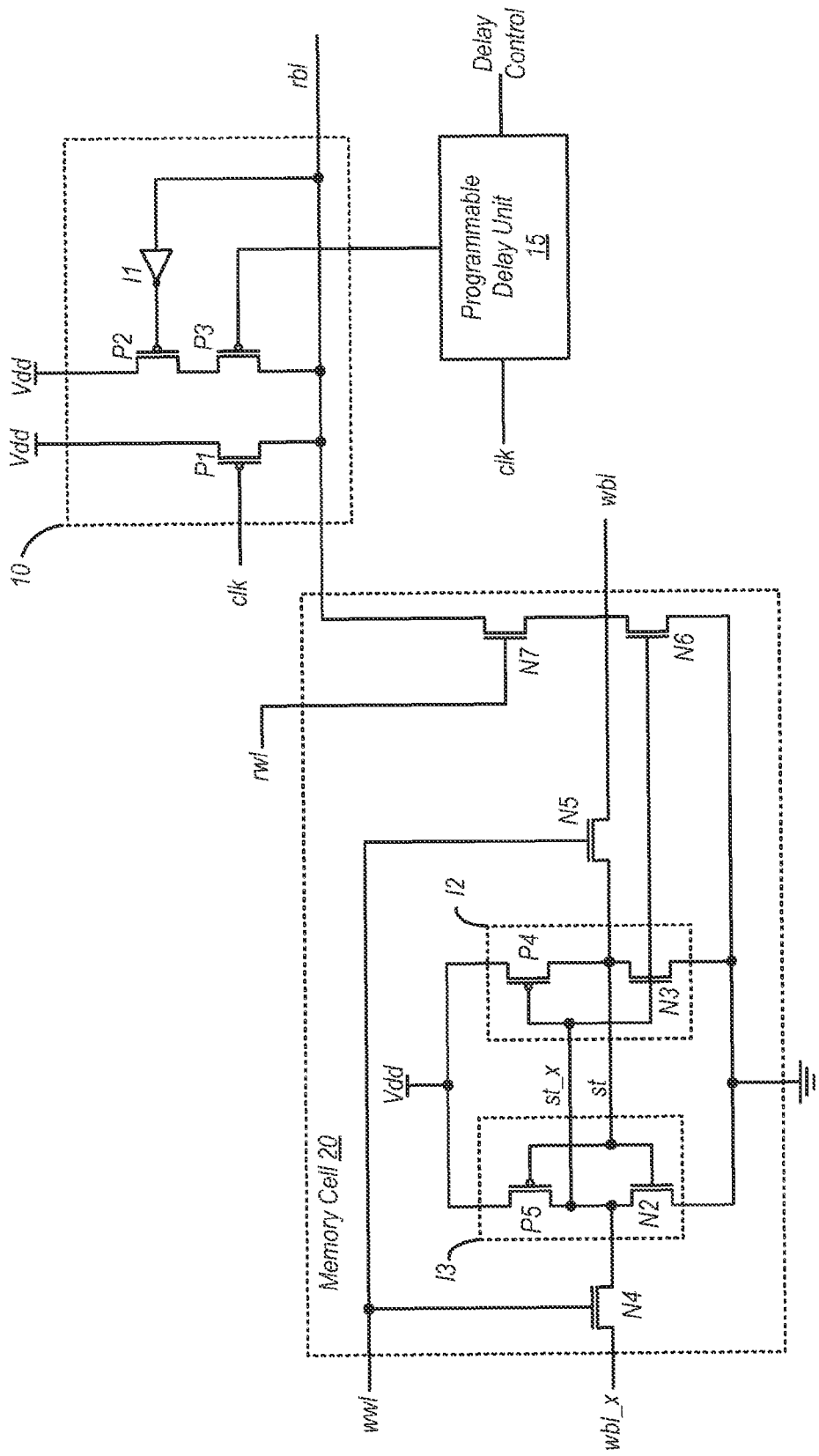
FIG. 3 is a schematic diagram illustrating one embodiment of a memory cell coupled to a dynamic logic circuit.

Memory Cell and Memory Array with Dynamic Logic Circuits:

FIG. 3 is a schematic diagram illustrating one embodiment of a memory cell coupled to a dynamic logic circuit. In the embodiment shown, memory cell 20 is coupled to dynamic logic circuit 10. Thus, in this example, memory cell 20 plays the role of an evaluation circuit from which a logic input is provided to dynamic circuit 10, with the read bit line ('rbl') coupled to memory cell 20 serving as the dynamic node of dynamic circuit 10. The dynamic logic circuit 10 in the embodiment shown may function in a similar manner as described above for the embodiment shown in FIG. 1. More particularly, dynamic logic circuit 10 may precharge the read bit line when the clock signal is low. If a read operation is conducted when the clock is high, the dynamic node may be evaluated according to a logic value provided from memory cell 20. If no read operation is performed when the clock signal is high, the read bit line may remain high. Furthermore, the programmable delay unit 15 may assert an active low signal to the gate of transistor P3 during the high portion of the clock signal, which may provide a pull-up path between the dynamic node and Vdd if transistor P2 is also active.

Memory cell 20 in this embodiment includes a keeper having two cross-coupled inverters, I2 and I3. Inverter I2 includes transistors P4 and N3, while inverter I3 includes transistors P5 and N2. Transistors N4 and N5 are gating transistors in this embodiment and thus are activated during a write to enable true and complementary values to be written into memory cell 29 from true ('wbl') and complementary ('wbl_x') write bit lines, respectively. Transistors N4 and N5 are NMOS transistors in this embodiment, and may be activated responsive to a logic high on the write word line ('ww1') coupled to each of their respective gate terminals. When transistors N4 and N5 are turned on, a logic value present on the true write bit line may be conveyed to a true storage node ('st'), while the complementary logic value may be conveyed from the complementary write bit line may be conveyed to a complementary storage node ('st_x'). When transistors N4 and N5 are turned off (i.e., when the write word line is low in this embodiment), the true and complementary storage nodes are isolated from the true and complementary write word lines.

Read operations in the embodiment shown may be performed responsive to assertion of a logic high on a read word line ('rwl'). Transistor N7 may activate responsive to a logic high asserted on the read word line. The logic value to which the dynamic node evaluates to during a read operation that occurs within the evaluation phase may then depend on the state of the complementary storage node, st_x. If a logic high is stored on the complementary storage node, transistor N6 may be active, and thus the read bit line may be pulled low (through transistors N6 and N7) during the read operation. If a logic high is stored on the complementary node, transistor N6 may be inactive, and thus the read bit line may remain high during the read operation.

The embodiment of memory cell 20 shown in FIG. 3 may be one of a number of different types of memory cells that may be coupled to an embodiment of a dynamic logic circuit such as dynamic circuit 10. Such memory cells may include a greater or lesser number of transistors, and may be arranged in a number of different ways.

Figure 4:
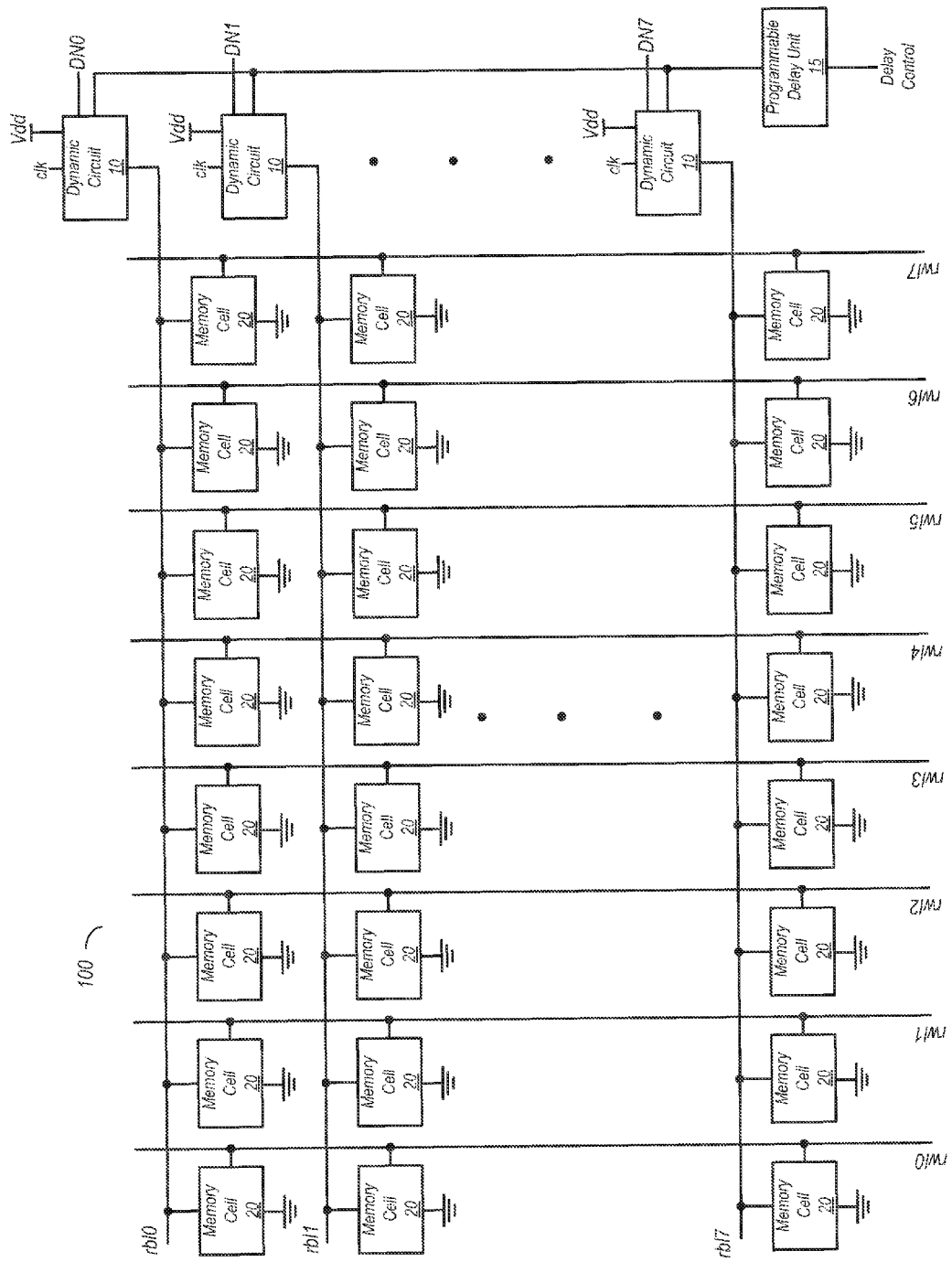
FIG. 4 is a block diagram illustration a portion of one embodiment of a memory having dynamic circuits coupled to respective bit lines.

Memory cell 20 may be one of a number of memory cells coupled to a single read bit line. FIG. 4 is a block diagram illustration a portion of one embodiment of a memory 100 having dynamic circuits 10 coupled to respective bit lines. Each of the dynamic circuit 10 in the embodiment shown is coupled to a programmable delay unit 15, and may thus may activate a transistor corresponding to P3 as discussed above at a delay time subsequent to commencing an evaluation phase. The delay provided by programmable delay unit may be common to all of the dynamic logic circuits 10 in one embodiment, but may be individually set for different ones of the dynamic logic circuits 10 in other embodiments.

For the sake of simplicity, the write bit lines and write word lines are not shown in FIG. 4, although these elements may be present for each memory cell in an arrangement according to that shown in FIG. 3, or in any other suitable arrangement. Furthermore, FIG. 4 shows only a portion of the total number of memory cells present in memory 100. It is also noted that memory 100 shown in FIG. 4 is exemplary, and that numerous other embodiments are possible and contemplated. Such embodiments may have a greater or lesser number of cells, larger or smaller word widths, and a greater or lesser number of words. The embodiment shown may also represent one bank of an embodiment including multiple memory banks.

In the embodiment shown, memory 100 includes a number of memory cells coupled to each coupled to a corresponding one of a number of read bit lines (rbl0, rbl1, etc.). Each read bit line may serve as the dynamic node for the respective dynamic logic circuit 10 coupled thereto. Each of the memory cells 20 is also coupled to a corresponding one of a number of read word lines (rwl0, rwl1, etc.). A group of memory cells 20 comprising a word may be selected for a read by the assertion a corresponding read word line. For example, if a logic high is asserted on rwl0, each memory cell 20 coupled thereto may be selected for a read, and may cause its corresponding read bit line to evaluate to a certain logic value based on a logic value stored therein. Each dynamic logic circuit 10 in the embodiment shown also includes a respective output node (DN0, DN1, etc) upon which the data read from the memory may be conveyed. This node may be the same node as the dynamic node in some embodiments, or may be a different node in other embodiments, particularly those where the portion of memory 100 shown is one of a bank of memory from which a read may be conducted.

Since the read bit lines in the embodiment shown serve as dynamic nodes for the dynamic logic circuits 10, having a number of memory cells 20 coupled thereto may provide a greater number of paths for potential leakage. Accordingly, the setting of the timing for the assertion of the delay signal by programmable delay unit 15 may take into account the amount of leakage that may result from the multiple cells coupled to each read bit line, while also taking into account the contention issues discussed above.

Figure 5:
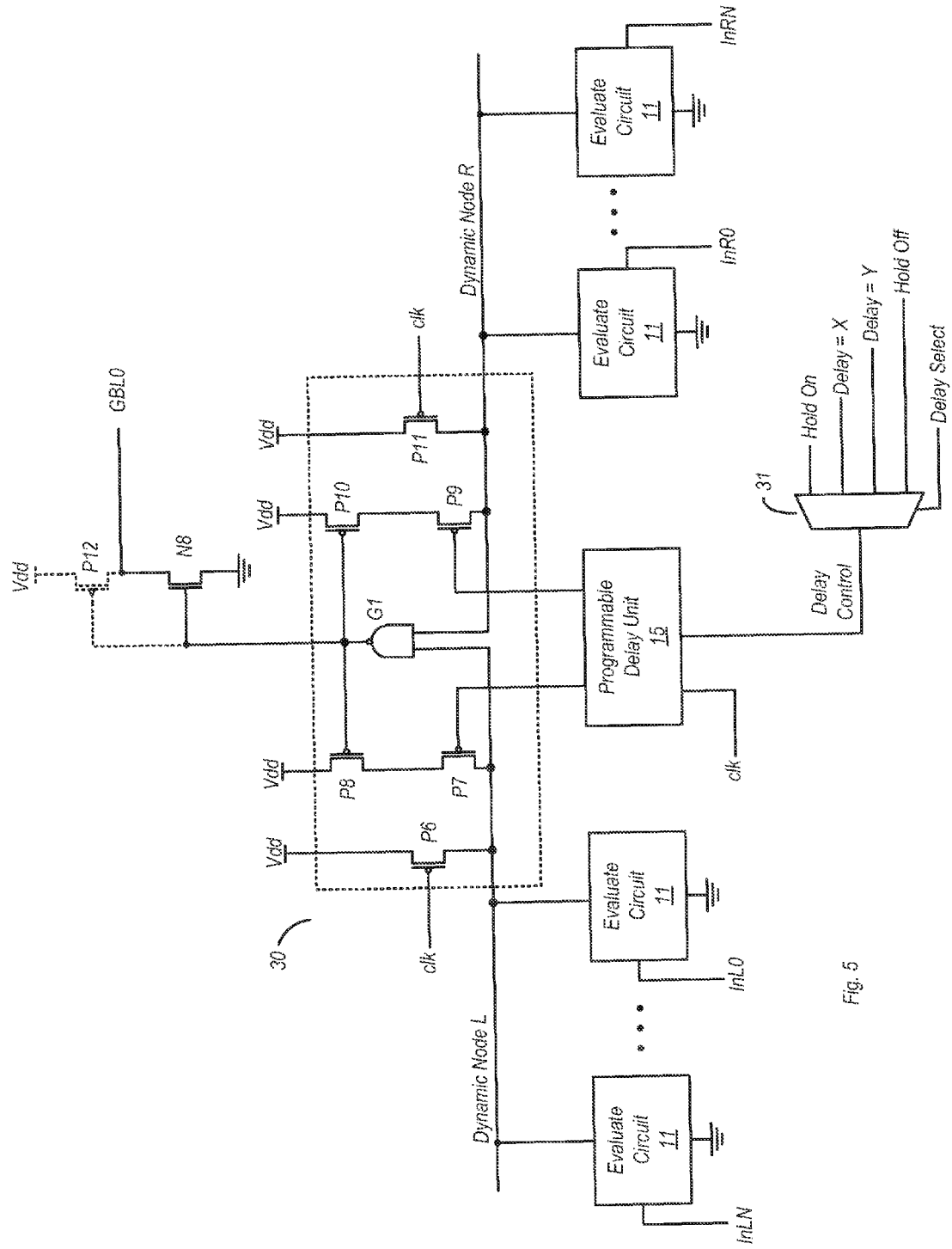
FIG. 5 is a block diagram illustrating an embodiment of a circuit including a dynamic circuit having multiple dynamic nodes and multiple evaluation circuits coupled to each dynamic node.

Dynamic Logic Circuit Having Multiple Dynamic Nodes:

FIG. 5 is a block diagram illustrating an embodiment of a circuit including a dynamic circuit having multiple dynamic nodes and multiple evaluation circuits coupled to each dynamic node. In this particular embodiment, dynamic logic circuit 30 includes a first dynamic node (Dynamic Node L, on the left portion of the drawing) and a second dynamic node (Dynamic Node R, right portion of the drawing). Each of a first plurality of N evaluate circuits 11 are coupled to the first dynamic node, while each of a plurality of a second plurality of N evaluate circuits 11 are coupled to the second dynamic node. The number of evaluate circuits N coupled to each dynamic node is an integer value and may vary from one embodiment to the next. The evaluate circuits 11 may be memory cells or other types of circuits. The input signals to the (InL0, InR0, etc.) may select a particular one of the evaluate circuits 11 to provide an output signal, while the other evaluate circuits may be inhibited (e.g., tri-stated) from providing a signal onto their respective dynamic node. Thus, the circuit shown in FIG. 5 may be arranged as a one-hot multiplexer structure, wherein only one evaluation circuit 11 may provide a signal to a dynamic node at a given time.

Dynamic logic circuit 30 in this embodiment is configured to precharge the first and second dynamic nodes when the clock is low. Transistor P6 and P7 in this embodiment are configured to activate when the clock is low in order to precharge the first and second dynamic nodes, respectively. When both the first and second dynamic nodes are precharged, gate G1 (a NAND gate in this embodiment) provides a logic low to the gate terminals of transistors P8 and P10. When the clock transitions high, one of the evaluation circuits 11 may be selected and may cause its respective dynamic node to be evaluated to either a logic high or a logic low. In the case where an evaluation circuit 11 causes its respective dynamic node to evaluate to a logic low, that dynamic node may be pulled low. When either of the dynamic nodes is pulled low in this embodiment, gate G1 outputs a logic high, and thus both transistors P8 and P10 may be deactivated. Furthermore, when gate G1 outputs a logic high, transistor N8 may be activated, thus causing the global bit line ('GBL0') to be pulled low.

If a selected one of the evaluate circuits 11 causes its respective dynamic node to evaluate to a logic high, gate G1 may continue to output a logic low. Both transistors P8 and P10 may thus remain activated, while transistor N8 is inactive. Accordingly, a logic high may be output on the global bit line. Additional circuitry to pull up and enforce a logic high on the global bit line may be included in some embodiments, such as the optional transistor P12 (shown in dashed lines) that may become active responsive to a low output by gate G1. In other embodiments, other types of circuitry (e.g., a pull-up resistor) may cause a logic high to be present on the global bit line when transistors N1 is inactive. Furthermore, the global bit line may also be subject to a precharge in the same manner as the dynamic nodes in some embodiments, and may be coupled to other circuitry (e.g., a flip-flop) in order to synchronize its output.

Programmable delay unit 15 may drive an active low signal to each of transistors P7 and P9 at a delay time subsequent to beginning the evaluation phase. The delay time may be set to allow a sufficient amount of time for either of the dynamic nodes to be pulled low by an evaluation circuit 11 according to a corresponding condition while also ensuring that transistors P8 and P10 are de-activated. Thus, if a selected one of the evaluate circuits 11 causes its respective dynamic node to evaluate to a logic low, that dynamic node may be pulled low, causing gate G1 to output a high (responsive to the low input) and therefore deactivate transistors P8 and P10. Programmable delay unit 15 may assert the active low signal at a delay time concurrent with or subsequent to the deactivation of transistors P8 and P10.

The delay time may also be set to reinforce a logic high evaluated on a dynamic node associated with a selected one of the evaluate circuits 11, by providing a pull-up path. As previously noted, when both dynamic nodes are high, gate G1 may output a low and thus cause transistors P8 and P10 to be active. However, leakage currents in the evaluate circuits 11 may also cause a logic high voltage to degrade toward a logic low without any intervention. If transistors P7 and P9 are activated when transistors P8 and P10 are active, pull-up paths to Vdd are provided for both dynamic nodes. Accordingly, the delay time set by programmable delay unit 15 may be such that transistors P7 and P9 are activated before an active dynamic node can, due to leakage, degrade to a logic low despite being evaluated to a logic high.

In this particular embodiment, the delay provided by programmable delay unit 15 is adjustable. Various inputs are provided to a multiplexer 31 in this embodiment to provide various delays. The range may at its low point provide no delay ('Hold On'), to which programmable delay unit 15 may respond by holding the active low signals to the gate terminals of P7 and P9 in an asserted condition. This setting may be used if the pull-down devices in the evaluate circuits 11 are strong, or may be used to enhance writeability in embodiments where the evaluate circuits 11 are memory cells. At the high point, programmable delay unit 15 may keep the active low signals de-asserted, causing transistors P7 and P9 to remain off. This setting may be used to track leakage currents of the dynamic nodes. Delay values X and Y may represent two different time delay values in which the active low signals are asserted by programmable delay unit 15 subsequent to entering the evaluation phase.

The example of the programmability shown in this embodiment is but one example of various methods that may be used to program the delay time at which programmable delay unit 15 asserts the active low signals after the evaluation phase begins. In another embodiment, the programming may be done a single time (e.g., at final manufacturing test) by blowing corresponding programming fuses. Embodiments are also possible and contemplated wherein the delay time is set during a boot-up procedure that includes a power-on self test for determining the most appropriate setting. In general, any method appropriate to a given embodiment may be used to set the delay time.

Figure 6:
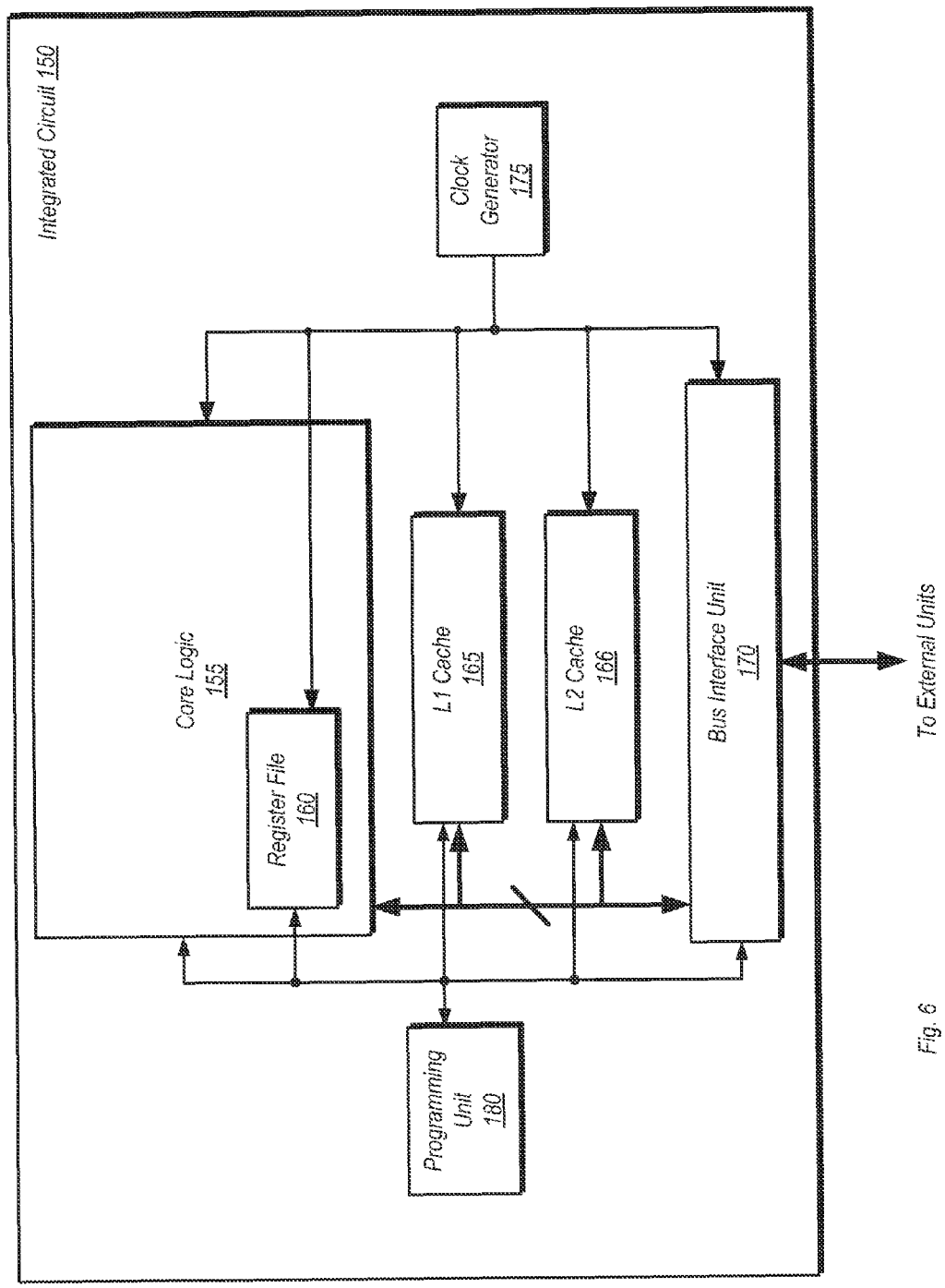
FIG. 6 is a block diagram of one embodiment of an integrated circuit.

Integrated Circuit:

FIG. 6 is a block diagram of one embodiment of an IC. IC 150 may be a processor for a computer system, an ASIC (application specific integrated circuit), or virtually any other type of IC in which clocked logic circuits may be implemented. In the embodiment shown, IC 150 includes a core logic unit 155 having a register file 160 implemented therein, an L1 (level one) cache 165, and L2 (level two) cache 166, a bus interface unit 170, a clock generator 175, and a programming unit 180. One or more of the units of IC 150 may include an embodiment of a dynamic logic circuit 10 or 30 discussed above or variations thereof. For example, register file 160 may include a number of memory cells 20 as discussed above in FIG. 2, with each being coupled to a read bit line that serves as a dynamic node in an arrangement such as that shown in FIG. 5. L1 cache 165 and L2 cache 166 may also be similarly arranged. Bus interface unit 170 may also include dynamic logic circuits in various embodiments that may include those described herein.

Clock generator 175 in the embodiment shown may be a phase locked loop (PLL) or other type of clock generating circuitry. One or more clock signals may be provided by clock generator 175 to each of the various units of IC 150. These clock signals may be provided to the dynamic logic circuits within IC 150, and may control the precharge and evaluation phases of these circuits.

Programming unit 180 may provide programming information to one or more programmable delay units 15 that are associated with various ones of the dynamic logic circuits of IC 150. In one embodiment, programming unit 180 may be implemented using fuses that are blown to program the delay times to provide an implementation that is one-time programmable. In another embodiment, programming unit 180 may be a type of non-volatile memory (e.g., a flash memory, a read-only memory, or other type) which stores the information for programming the delays, and may be updatable to respond to new operating conditions. In addition, programming unit 180 may store different programming information for different programmable delay units within IC 150 so that the delay time for each dynamic circuit is set in a manner appropriate for local conditions.

Figure 7:
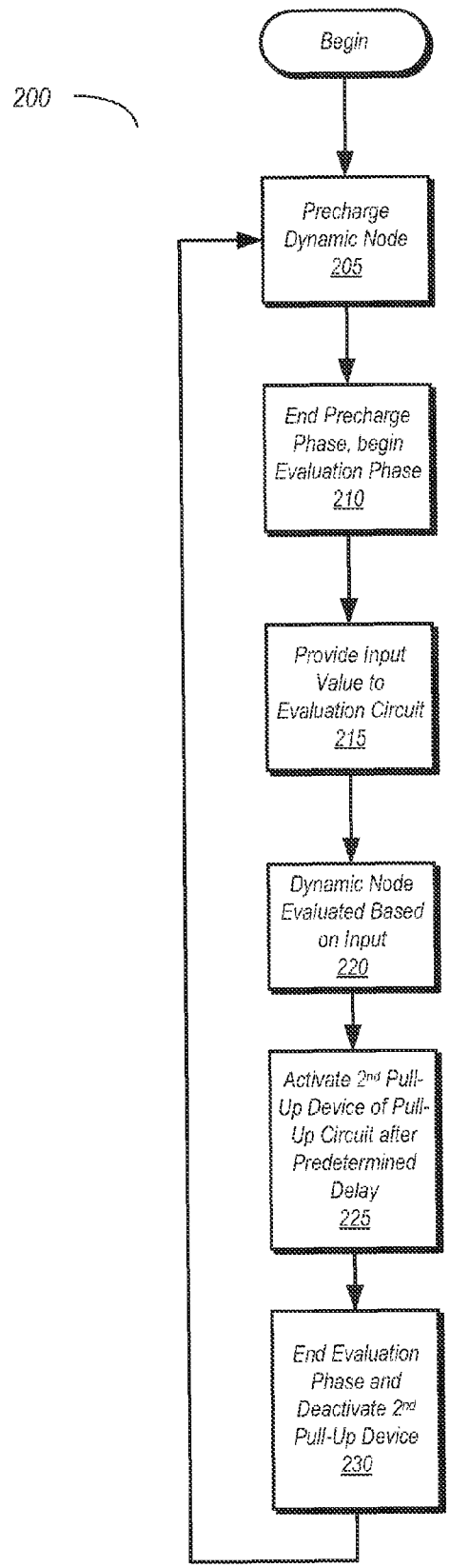
FIG. 7 is a flow diagram of one embodiment of a method for operating a dynamic circuit.

Flow Diagram:

Turning now to FIG. 7, a flow diagram of one embodiment of a method for operating a dynamic logic circuit is shown. In the embodiment shown, method 200 begins with the precharging of a dynamic node of the dynamic logic circuit (block 205). The precharge may be accomplished during a first phase of a clock signal (e.g., when the clock is low) by pulling the dynamic node high through a pull-up path activated responsive to the first clock phase (e.g., through a PMOS transistor coupled between the dynamic node and a supply voltage node).

After the precharge phase ends, and evaluation phase may begin (block 210). The precharge phase may end in one embodiment when the clock signal transitions from its first phase (e.g., clock low) to its second phase (e.g., clock high). A transition of the clock from a low to a high may turn off a PMOS transistor or other type of circuit providing a pull-up path between the dynamic node and the supply voltage node for the purposes of conducting the precharge.

Subsequent to the entering of the evaluation phase, an input signal may be provided to an evaluation circuit (block 215). Responsive to the input, the evaluation circuit may evaluate the dynamic node to either a logic high or a logic low (block 220). The evaluation circuit may be a simple NMOS transistor (such as that shown in FIG. 1), a memory cell (such as that shown in FIG. 2), or other type of circuit capable of changing the state of the dynamic node responsive to a given input.

At a predetermined delay time subsequent to entering the evaluation phase, a second of two devices in a pull-up circuit be activated (block 225). For example, transistors P2 and P3 shown in FIG. 1 may form a pull-up circuit, with P3 being the second of these two devices. The first of these two devices may be active if the dynamic node is evaluated to a logic high, and thus the activation of the second provides a pull-up path between the dynamic node and the voltage supply node. If the first of these two devices is inactive, the activation of the second device does not provide a pull-up path. However, the delayed activation of the second device may prevent contention between the first device and a pull-down circuit (e.g. an NMOS transistor) when the dynamic node is evaluated low.

Concurrent with the ending of the evaluation phase, the second device may be deactivated (block 230). After the evaluation phase ends (e.g., when the clock falls low again), the precharge phase may commence for the next cycle, and the method may repeat.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A circuit comprising:
   a precharge circuit configured to, during a precharge phase, pull a first dynamic node toward a voltage present on the voltage supply node;
   a first evaluation circuit configured to, during an evaluation phase, pull the first dynamic node toward a ground voltage responsive to a first input condition and configured to inhibit pulling of the dynamic node toward the ground voltage responsive to a second input condition; and
   a first pull-up circuit coupled between the first dynamic node and the voltage supply node, wherein the pull-up circuit includes:
      a first pull-up transistor wherein the first pull-up transistor is configured to activate responsive to the precharge phase; and
      a second pull-up transistor, wherein the second pull-up transistor is configured to activate at a delay time subsequent to entry of the evaluation phase, wherein a pull-up path is provided between the first dynamic node and the voltage supply node when both the first and second pull-up transistors are active; and
   wherein the circuit further comprises a plurality of evaluation circuits coupled to the first dynamic node, the plurality of evaluation circuits including the first evaluation circuit, wherein the plurality of evaluation circuits form a one-hot multiplexer structure.

2. The circuit as recited in claim 1, wherein the circuit further comprises a delay control circuit coupled to a gate terminal of the second pull-up transistor, wherein the delay control circuit is configured to activate the second pull-up transistor after a pre-determined delay has elapsed.

3. The circuit as recited in claim 2, wherein the delay control circuit is programmable to one or more values of the predetermined delay.

4. The circuit as recited in claim 3, wherein the predetermined delay is adjustable.

5. The circuit as recited in claim 1, wherein a gate terminal of the precharge transistor is configured to receive a clock signal, wherein the precharge phase is concurrent with a low phase of the clock signal, and wherein the evaluation phase is concurrent with a high phase of the clock signal.

6. The circuit as recited in claim 1, wherein the first pull-up transistor is coupled between the voltage supply node and the second transistor, and wherein the second transistor is coupled between the first transistor and the dynamic node.

7. The circuit as recited in claim 1 further comprising an inverter coupled between the dynamic node and a gate terminal of the first pull-up transistor.

8. The circuit as recited in claim 1, further comprising a second dynamic node, a second pull-up circuit coupled to the second dynamic node, a second evaluation circuit coupled to the second dynamic node, and the delay control circuit coupled to each of the first and second pull-up circuits.

9. The circuit as recited in claim 8, further comprising:
   a first plurality of evaluation circuits including the first evaluation circuit, wherein each of the first plurality of evaluation circuits is coupled to the first dynamic node;
   a second plurality of evaluation circuits including the second evaluation circuit, wherein each of the second plurality of evaluation circuits is coupled to the second dynamic node, and wherein the first and second pluralities of evaluation circuits form a one-hot multiplexer structure;
   a logic gate coupled to each of the first and second dynamic nodes; and
   an output circuit coupled to an output of the logic gate and configured to drive a global output line based on logic evaluated by one of the first and second pluralities of evaluation circuits and conveyed to the logic gate via one of the first and second dynamic nodes.

10. A method comprising:
   precharging a dynamic node of a dynamic circuit to a first logic value during a first phase of a clock signal;
   activating, responsive to said precharging, a first device of a pull-up circuit coupled between the dynamic node and a voltage supply node;
   ending the precharge phase and beginning an evaluation phase responsive to the clock signal transitioning from the first phase to a second phase;
   providing an input signal to a selected one of a plurality of evaluation circuits coupled to the dynamic node, wherein the plurality of evaluation circuits forms a one-hot multiplexer structure;
   evaluating a logic value on the dynamic node responsive to providing the input signal; and
   activating a second device of the pull-up circuit at a predetermined delay time subsequent to beginning of the evaluation phase, wherein a pull-up path is provided between the first dynamic node and the voltage supply node when both the first and second devices are active.

11. The method as recited in claim 10, wherein said evaluating comprises the selected one of the plurality of evaluation circuits pulling the dynamic node toward a ground voltage responsive to an evaluation circuit evaluating the dynamic node to a second logic value, and wherein said evaluating further comprises the dynamic node remaining at the first logic value responsive to the selected one of the plurality of evaluation circuits evaluating the dynamic node to the first logic value.

12. The method as recited in claim 11, further comprising pulling the dynamic node toward the supply voltage responsive to activating the second device when the first device is also active.

13. The method as recited in claim 11, further comprising the selected one of the plurality of evaluation circuits evaluating the dynamic node responsive to a logic value of the input signal.

14. The method as recited in claim 11, wherein the selected one of the plurality of evaluation circuits is a memory cell, and wherein the method further comprises evaluating the dynamic node responsive to a logic value stored in the memory cell.

15. The method as recited in claim 11, further comprising performing said precharging concurrent with a low phase of the clock signal and performing said evaluating concurrent with a high phase of the clock signal.

16. An integrated circuit comprising:
   a clock generation unit configured to generate a clock signal;
   a functional unit coupled to receive a clock signal from the clock generation unit; and
   one or more memory circuits;
   wherein at least one of the functional unit and one or more memory circuits includes a dynamic circuit, wherein the dynamic circuit includes:
      a precharge device configured to precharge a dynamic node to a supply voltage during a first phase of the clock signal;
      a plurality of evaluation circuits, wherein the plurality of evaluation circuits forms a one-hot multiplexer structure, and wherein each of the plurality of evaluation circuits is configured to, when selected during a second phase of the clock signal, cause the dynamic node to evaluate a first logic value responsive to a first input condition or a second logic value responsive to a second condition; and
      a pull-up circuit including a first transistor and a second transistor, wherein the first transistor is configured to activate responsive to the precharge device precharging the dynamic node, and wherein the second device is configured to activate at a delay time subsequent to the clock signal transitioning to the second phase.

17. The integrated circuit as recited in claim 16, wherein the pull-up circuit is configured to pull the dynamic node toward the supply voltage when the first and second devices are both active.

18. The integrated circuit as recited in claim 16, wherein the first logic value is a logic low, and wherein the evaluation circuit is configured to pull the dynamic node toward a ground voltage responsive to the first condition.

19. The integrated circuit as recited in claim 16, wherein the integrated circuit includes a programming unit configured to program a value of the delay time.

20. The circuit as recited in claim 1, wherein during an evaluation phase, all but a selected one of the plurality of evaluation circuits is tri-stated during the evaluation phase.

* * * * *